(12) United States Patent
Kim et al.

(10) Patent No.: US 11,280,688 B2
(45) Date of Patent: Mar. 22, 2022

(54) CORE-SHELL STRUCTURED FIBER TYPE STRAIN SENSOR AND METHOD OF MANUFACTURING THE SAME

(71) Applicant: KOREA ADVANCED INSTITUTE OF SCIENCE AND TECHNOLOGY, Daejeon (KR)

(72) Inventors: Seong Su Kim, Daejeon (KR); Seung Yoon On, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 156 days.

(21) Appl. No.: 16/757,538

(22) PCT Filed: Mar. 23, 2020

(86) PCT No.: PCT/KR2020/003915
§ 371 (c)(1),
(2) Date: Apr. 20, 2020

(87) PCT Pub. No.: WO2021/075648
PCT Pub. Date: Apr. 22, 2012

(65) Prior Publication Data
US 2021/0404892 A1   Dec. 30, 2021

(30) Foreign Application Priority Data

Oct. 18, 2019   (KR) .......................... 10-2019-0130104

(51) Int. Cl.
*G01L 1/00*   (2006.01)
*G01L 1/22*   (2006.01)
(Continued)

(52) U.S. Cl.
CPC ........... *G01L 1/2287* (2013.01); *D06M 11/74* (2013.01); *D06M 15/564* (2013.01); *G01L 1/2206* (2013.01); *D06M 2101/20* (2013.01)

(58) Field of Classification Search
CPC .... G01L 1/2287; G01L 1/2206; D06M 11/74; D06M 2101/20
See application file for complete search history.

(56) References Cited

U.S. PATENT DOCUMENTS 9,677,967 B2 * 6/2017 Pereira ................ G01M 5/0033
10,804,038 B2 * 10/2020 O'Brien ................ H02N 2/181
(Continued)

FOREIGN PATENT DOCUMENTS

| KR | 10-1881195 | 7/2018 |
|---|---|---|
| KR | 10-2018-0101038 | 9/2018 |
| KR | 10-2019-0062020 | 6/2019 |

OTHER PUBLICATIONS

International Search Report dated Jul. 9, 2020 for PCT/KR2020/003915.
(Continued)

*Primary Examiner* — Max H Noori

(57) ABSTRACT

The core-shell structured fiber-type strain sensor of the present disclosure, which includes a fibrous support forming a core and a multilayered shell layer formed on the fibrous support, exhibits improved strength and stiffness due to the core fiber, exhibits improved noise level due to an elastomer layer and allows manufacturing of a fiber-type sensor with improved linearity of measurement signals due to a sandwich-structured conductive layer, is advantageous in that stable strain measurement is possible without acting as a defect in a composite structure.

17 Claims, 8 Drawing Sheets

(51) Int. Cl.
*D06M 11/74* (2006.01)
*D06M 15/564* (2006.01)
*D06M 101/20* (2006.01)

(56) References Cited

U.S. PATENT DOCUMENTS

| | | | |
|---|---|---|---|
| 11,175,544 B2* | 11/2021 | Yang | G02F 1/13439 |
| 2005/0282009 A1 | 12/2005 | Musko et al. | |
| 2006/0090925 A1* | 5/2006 | Spruell | H01B 7/184 |
| | | | 174/120 R |
| 2010/0094081 A1* | 4/2010 | Rothe | A61B 1/00087 |
| | | | 600/104 |
| 2011/0132660 A1* | 6/2011 | Struwe | D07B 7/16 |
| | | | 174/74 A |
| 2011/0232937 A1* | 9/2011 | Montena | C09D 7/61 |
| | | | 174/106 R |
| 2011/0239451 A1* | 10/2011 | Montena | H01R 24/56 |
| | | | 29/747 |
| 2016/0121598 A1* | 5/2016 | Zhou | B41F 3/54 |
| | | | 101/216 |
| 2017/0059421 A1 | 3/2017 | Servati et al. | |
| 2018/0366242 A1* | 12/2018 | Farrell | H01R 13/6584 |

OTHER PUBLICATIONS

Seung Yoon On et al., "Study on the core-shell structured fiber type strain sensor with load bearing characteristics in composite structure", *22nd International Conference on Composite Materials 2019 (ICCM22)*, Aug. 2019, Melbourne, Australia.

* cited by examiner (a) : DP-SC2

(b) : DP-SC3

(c) : DP-MC

CORE-SHELL STRUCTURED FIBER TYPE STRAIN SENSOR AND METHOD OF MANUFACTURING THE SAME

This application claims the priority of Korean Patent Application No. 10-2019-0130104, filed on Oct. 18, 2019 in the KIPO (Korean Intellectual Property Office), the disclosure of which is incorporated herein entirely by reference. Further, this application is the National Stage application of International Application No. PCT/KR2020/003915, filed Mar. 23, 2020, which designates the United States and was published in Korean. Each of these applications is hereby incorporated by reference in their entirety into the present application.

TECHNICAL FIELD

The present disclosure relates to a core-shell structured fiber-type strain sensor and a method for manufacturing the same, more particularly to a core-shell structured fiber-type strain sensor with improved strength and stiffness due to a core fiber, improved noise level due to an elastomer layer, and improved linearity of measurement signals due to a sandwich-structured conductive layer, and a method for manufacturing the same.

BACKGROUND ART

Fiber-reinforced composite materials are used in various applications including aerospace and automobile industries due to excellent specific strength, specific stiffness, damping characteristics, etc. However, repeated application of load causes inter-laminar delamination that can lead to fracture at the interface between a reinforcing fiber and a matrix resin, which is the most vulnerable part of the composite. For this reason, researches are actively being carried out on structural health monitoring using a sensor network, which allows early detection and prevention of defects in composite materials.

In the existing structural health monitoring system, a strain gauge and a fiber Bragg grating sensor have been used in general.

Although the strain gauge is advantageous in terms of each attachment and high sensitivity, it is disadvantageous in that it cannot be embedded between laminae and many sensor nodes are necessary for detection of microdefects. The fiber Bragg grating sensor is advantageous in that it can be embedded for use, but there are problems that defects may occur in the composite due to large diameter and worse mechanical properties as compared to reinforcing fibers.

In order to solve these problems of the existing system, use of a conductive particle-based nanocomposite, which has unique electromechanical properties and the physical properties of which can be designed freely through combination of the constituent materials, can be considered as an alternative. However, the existing nanocomposite sensor is focused on the development of a sensor with flexibility for application to bio and wearable applications, and is not suitable for the composite-structured structural health monitoring system. In addition, most researches are focused on the improvement of sensitivity.

For example, Korean Patent Publication No. 10-2016-0118025 discloses a strain sensor with conductivity, wherein a nanowire is formed on a substrate. However, it is not suitable for a highly-loaded structure since load is applied directly to the substrate itself.

Accordingly, there is need for development of a strain sensor for structural health monitoring of a composite structure, which has superior mechanical properties so as to be embedded without decline in physical properties, as well as low noise level and high linearity for stable strain sensing.

DISCLOSURE OF THE INVENTION

Technical Problem

The present disclosure is directed to providing a strain sensor which has noise level and linearity suitable for strain sensing of a composite structure while capable of bearing load, and a method for manufacturing the same.

Technical Solution

In an exemplary embodiment, the present disclosure provides a core-shell structured fiber-type strain sensor, which includes: a fibrous support forming a core; and a multilayered shell layer formed on the fibrous support, wherein the shell layer includes: a first elastomer formed on the fibrous support; a conductive layer formed on the first elastomer; and a second elastomer formed on the conductive layer, and the sensor senses the strain of a structure including the sensor based on the change in resistance of the conductive layer.

More specifically, the conductive layer may have a sandwich structure wherein at least two unit conductive layers having different conductivity are laminated sequentially.

The unit conductive layer may include conductive particles, and the two unit conductive layers may have different conductivity by varying the wt % of the conductive particles. Specifically, the conductive layer may have a sandwich structure including: a first unit conductive layer; a second unit conductive layer; and a first unit conductive layer, wherein the second unit conductive layer includes the conductive particles at a lower percentage than the first unit conductive layer.

The fibrous support may be a single filament.

The first elastomer and the second elastomer may have higher Poisson's ratios than the fibrous support, and the first elastomer and the second elastomer may include one selected from a group consisting of polyurethane (PU), polydimethylsiloxane (PDMS), natural rubber (NR), butadiene rubber (BR), styrene-butadiene rubber (SBR), acrylonitrile-butadiene rubber (NBR) and ethylene-vinyl acetate (EVA).

In addition, the conductive particle may include one selected from a group consisting of carbon nanotube, graphene, silver nanowire and gold nanowire.

In an exemplary embodiment, the present disclosure provides a method for manufacturing a core-shell structured fiber-type strain sensor, which includes: a step of coating a first elastomer on a fibrous support; a step of coating a sandwich-structured conductive layer on the first elastomer; and a step of coating a second elastomer on the conductive layer, wherein the sandwich-structured conductive layer has a structure wherein unit conductive layers having different conductivity are laminated sequentially.

The coating may be performed by dipping or spraying.

In addition, the unit conductive layer includes conductive particles, and the two unit conductive layers have different conductivity by varying the wt % of the conductive particles.

The conductive layer may have a sandwich structure including: a first unit conductive layer; a second unit conductive layer; and a first unit conductive layer, wherein the second unit conductive layer includes the conductive particles at a lower percentage than the first unit conductive layer. The fibrous support may be a single filament.

The first elastomer and the second elastomer may have higher Poisson's ratios than the fibrous support, and the first elastomer and the second elastomer may include one selected from a group consisting of polyurethane (PU), polydimethylsiloxane (PDMS), natural rubber (NR), butadiene rubber (BR), styrene-butadiene rubber (SBR), acrylonitrile-butadiene rubber (NBR) and ethylene-vinyl acetate (EVA).

In addition, the conductive particle may include one selected from a group consisting of carbon nanotube, graphene, silver nanowire and gold nanowire.

Advantageous Effects

Use of an ultrahigh-strength core fiber and a multilayered sensing shell layer including an elastomer layer and a sandwich-structured laminated conductive layer according to the present disclosure allows stable strain measurement with no defect inside a composite structure since strength and stiffness are improved due to the core fiber, noise level is improved due to the elastomer layer and a fiber-type sensor with improved linearity of measurement signals can be prepared due to the sandwich-structured conductive layer. Accordingly, the problem of the existing sensor, which acts as a defect in the composite structure, can be solved. In addition, the sensor according to the present disclosure is applicable to wider applications, provides more reliable measurement result and can be manufactured at lower cost than the existing sensor because continuous manufacturing is possible.

BEST MODE FOR CARRYING OUT THE INVENTION

Hereinafter, the embodiments of the present disclosure will be described in detail with reference to accompanying drawings.

The present disclosure can be modified in various ways and can be embodied variously. Hereinafter, specific exemplary embodiments of the present disclosure will be described in detail with reference to accompanying drawings.

However, the present disclosure is not limited to the specific exemplary embodiments, but should be understood as including all changes, equivalents and substitutes included in the spirit and scope of the present disclosure. In the description of the present disclosure, detailed description of known technology will be omitted when it may obscure the subject matter of the present disclosure.

The terminology used herein is for the purpose of describing particular exemplary embodiments only and is not intended to limit the present disclosure. Singular expressions include plural expressions unless the context clearly indicates otherwise.

In the present disclosure, the terms "include", "have", etc. are intended to indicate that there is a feature, number, step, operation, component, part or a combination thereof described in the specification, and it is to be understood that the present disclosure does not preclude the possibility of the presence of additional feature, number, step, operation, component, part or a combination thereof.

The present disclosure relates to a core-shell structured fiber-type strain sensor and a method for manufacturing the same, more particularly to a core-shell structured fiber-type strain sensor with improved strength and stiffness due to a core fiber, improved noise level due to an elastomer layer, and improved linearity of measurement signals due to a sandwich-structured conductive layer, and a method for manufacturing the same.

Hereinafter, the present disclosure is described in detail.

Figure 1:
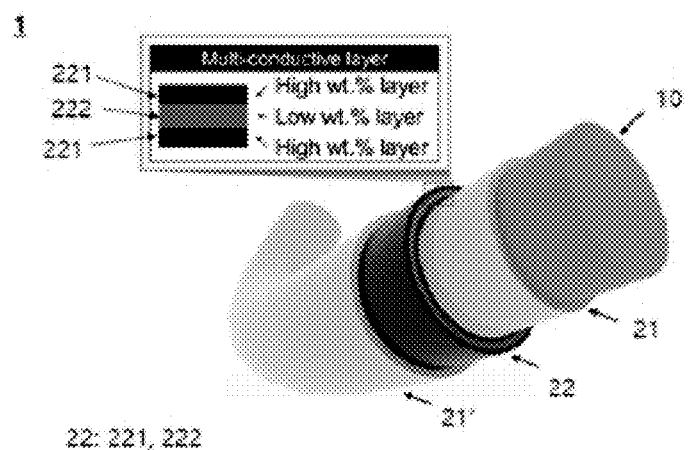
FIG. 1 schematically shows the structure of a core-shell structured fiber-type strain sensor according to an exemplary embodiment of the present disclosure.

FIG. 1 schematically shows the structure of a core-shell structured fiber-type strain sensor according to an exemplary embodiment of the present disclosure.

Referring to FIG. 1, a core-shell structured fiber-type strain sensor 1 according to an exemplary embodiment of the present disclosure includes: a fibrous support 10 forming a core; and a multilayered shell layer 20 formed on the fibrous support 10, wherein the shell layer 20 includes: a first elastomer 21 formed on the fibrous support 10; a conductive layer 22 formed on the first elastomer 21; and a second elastomer 21' formed on the conductive layer 22.

The core-shell structured fiber-type strain sensor 1 senses the strain of a structure including the sensor based on the change in resistance of the conductive layer 22.

The core-shell structured fiber-type strain sensor 1 according to an exemplary embodiment of the present disclosure allows easy and stable strain measurement without acting as a defect inside the composite structure since strength and stiffness are improved due to the fibrous support 10 forming a core, noise level is improved due to the elastomer, and the linearity of measurement signals is improved due to the conductive layer 22. For reference, whereas the existing sensor acts as a defect inside a composite when embedded therein, the core-shell structured fiber-type strain sensor 1 of the present disclosure using the high-strength core fiber is advantageous in that the structural reliability of the entire structure can be maintained and the strain distribution inside the structure can be monitored since the difference in mechanical properties from those of the reinforcing fiber used in the composite can be reduced.

First, the fibrous support 10 forming a core may be a single filament. Ultrahigh-molecular-weight polyethylene (UHMWPE) having superior mechanical properties may be used. And, the fibrous support 10 may be prepared into a fibrous form through a wet process such as air-gap wet spinning, wet spinning, etc.

Specifically, an initially spun fiber is drawn as it passes through a heat-drawing roller. Through this, mechanical properties can be maximized through arrangement of molecular chains in the fiber length direction. For this, the optimum treatment temperature may be determined between the melting point and the recrystallization temperature of the polymer material.

The elastomer is coated uniformly on the surface of the fibrous support 10. It may be coated by dip coating, spray coating, etc. For example, it may be coated by dip coating.

The first elastomer 21 and the second elastomer 21' have higher Poisson's ratios than the fibrous support 10.

The "Poisson's ratio" refers to the ratio of transverse strain and longitudinal strain when vertical stress is applied to a material. It can be a measure of the material behavior which is important factor in estimating strain in an elastic deformation region.

Specifically, the first elastomer 21 and the second elastomer 21' may include one selected from a group consisting of polyurethane (PU), polydimethylsiloxane (PDMS), natural rubber (NR), butadiene rubber (BR), styrene-butadiene rubber (SBR), acrylonitrile-butadiene rubber (NBR) and ethylene-vinyl acetate (EVA). The first elastomer 21 and the second elastomer 21' may be the same elastomer or may be different elastomers. For example, the first elastomer 21 and the second elastomer 21' may be polyurethane (PU).

In particular, the two elastomer layers 21, 21' surrounding the conductive layer 22, i.e., the first elastomer 21 and the second elastomer 21', may induce compressive deformation of the conductive layer 22, thereby preventing fracture of the conductive network in the fiber radial direction and greatly reducing the noise level of the sensor.

In addition, the conductive layer 22 may have a sandwich structure wherein at least two unit conductive layers 22 having different conductivity are laminated sequentially. Specifically, the unit conductive layer 22 may include conductive particles, and the two unit conductive layers 22 may have different conductivity by varying the wt % of the conductive particles. More specifically, it may be prepared by alternately laminating a layer with a higher weight percentage of the conductive particles, which has stable response characteristics, and a layer with a lower concentration, which has high sensitivity. In particular, the sandwich-structured electrically conductive layer 22 can realize a sensitive sensor with excellent linearity by complementing the characteristics of each layer through parallel connection.

For example, the conductive layer 22 may have a sandwich structure including a first unit conductive layer 221, a second unit conductive layer 222 and a first unit conductive layer 221, and the second unit conductive layer 222 may include the conductive particles at a lower percentage than the first unit conductive layer 221.

The conductive particle may include one selected from a group consisting of carbon nanotube, graphene, silver nanowire and gold nanowire. For example, it may be carbon nanotube.

More specifically, the conductive layer 22 may be prepared from a water-based coating solution in which the conductive particles are dispersed. For more stable sensing, a coating solution in which the conductive particles are dispersed in a thermoplastic polymer may be used. In addition, desired characteristics may be designed by varying the order and number of lamination of the sandwich-structured conductive layer 22. If the fiber-type strain sensor 1 is manufactured in this way, manufacturing cost can be reduced because manufacturing can be achieved through a continuous process from the preparation of the fibrous support 10 to the formation of the shell layer 20.

Figure 2:
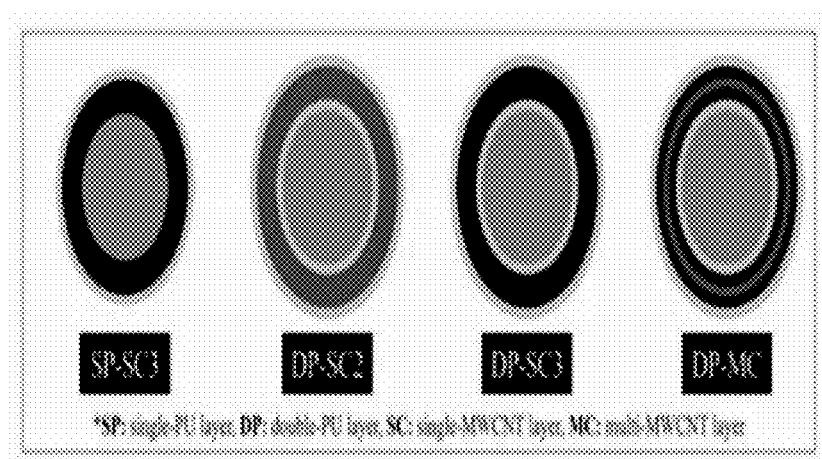
FIG. 2 shows the structures of core-shell structured fiber-type strain sensors according to an exemplary embodiment of the present disclosure.

FIG. 2 shows the structures of the core-shell structured fiber-type strain sensor according to an exemplary embodiment of the present disclosure.

Figure 3:
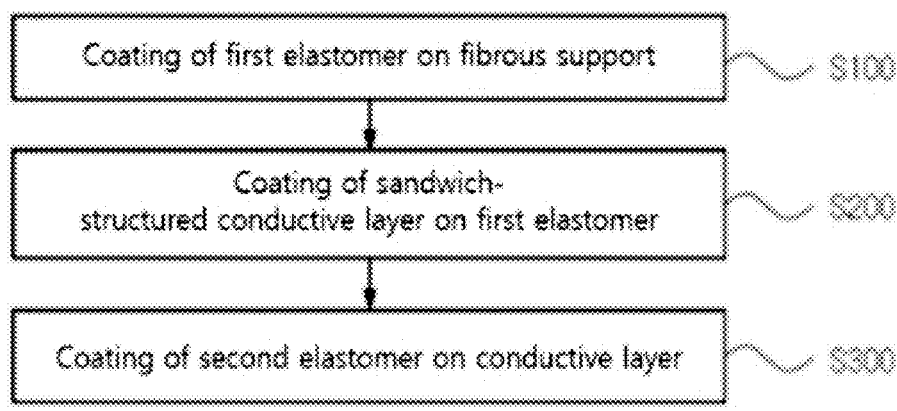
FIG. 3 is a flow chart describing a method for manufacturing a core-shell structured fiber-type strain sensor according to an exemplary embodiment of the present disclosure.

FIG. 3 is a flow chart describing a method for manufacturing a core-shell structured fiber-type strain sensor according to an exemplary embodiment of the present disclosure. A method for manufacturing the core-shell structured fiber-type strain sensor 1 according to an exemplary embodiment of the present disclosure is described referring to FIG. 3.

Specifically, the, method for manufacturing the core-shell structured fiber-type strain sensor 1 according to an exemplary embodiment of the present disclosure includes: a step S100 of coating a first elastomer 21 on a fibrous support 10; a step S200 of coating a sandwich-structured conductive layer 22 on the first elastomer 21; and a step S300 of coating a second elastomer 21' on the conductive layer 22.

The sandwich-structured conductive layer 22 may have a structure wherein unit conductive layers 22 having different conductivity are laminated sequentially.

First, the fibrous support 10 forming a core may be a single filament. Ultrahigh-molecular-weight polyethylene (UHMWPE) having superior mechanical properties may be used.

The fibrous support 10 may be prepared into a fibrous form through a wet process such as air-gap wet spinning, wet spinning, etc. For example, the fibrous support 10 may be prepared by preparing a spinning solution by dissolving UHMWPE powder in a solvent and then conducing dry-jet wet spinning with the spinning solution.

An initially spun fiber may be drawn as it passes through a heat-drawing roller. Through this, mechanical properties can be maximized through arrangement of molecular chains in the fiber length direction. For this, the optimum treatment temperature may be determined between the melting point and the recrystallization temperature of the polymer material.

Then, the coating in the coating steps S100, S200, S300 may be performed by dip coating or spray coating. For example, dip coating may be used.

The first elastomer 21 and the second elastomer 21' have higher Poisson's ratios than the fibrous support 10.

The "Poisson's ratio" refers to the ratio of transverse strain and longitudinal strain when vertical stress is applied to a material. It can be a measure of the material behavior which is important factor in estimating strain in an elastic deformation region.

Specifically, the first elastomer 21 and the second elastomer 21' may include one selected from a group consisting of polyurethane (PU), polydimethylsiloxane (PDMS), natural rubber (NR), butadiene rubber (BR), styrene-butadiene rubber (SBR), acrylonitrile-butadiene rubber (NBR) and ethylene-vinyl acetate (EVA). The first elastomer 21 and the second elastomer 21' may be the same elastomer or may be different elastomers. For example, the first elastomer 21 and the second elastomer 21' may be polyurethane (PU).

In particular, the two elastomer layers 21, 21' surrounding the conductive layer 22, i.e., the first elastomer 21 and the second elastomer 21', may induce compressive deformation of the conductive layer 22, thereby preventing fracture of the conductive network in the fiber radial direction and greatly reducing the noise level of the sensor.

In addition, the conductive layer 22 may have include conductive particles, and the two unit conductive layers 22 may have different conductivity by varying the wt % of the conductive particles. More specifically, it may be prepared by alternately laminating a layer with a higher weight percentage of the conductive particles, which has stable response characteristics, and a layer with a lower concentration, which has high sensitivity. In particular, the sandwich-structured electrically conductive layer 22 can realize a sensitive sensor with excellent linearity by complementing the characteristics of each layer through parallel connection.

For example, the conductive layer 22 may have a sandwich structure including a first unit conductive layer 221, a second unit conductive layer 222 and a first unit conductive layer 221, and the second unit conductive layer 222 may include the conductive particles at a lower percentage than the first unit conductive layer 221.

The conductive particle may include one selected from a group consisting of carbon nanotube, graphene, silver nanowire and gold nanowire. For example, it may be carbon nanotube.

More specifically, the conductive layer 22 may be prepared from a water-based coating solution in which the conductive particles are dispersed. For more stable sensing, a coating solution in which the conductive particles are dispersed in a thermoplastic polymer may be used. In addition, desired characteristics may be designed by varying the order and number of lamination of the sandwich-structured conductive layer 22. If the fiber-type strain sensor 1 is manufactured in this way, manufacturing cost can be reduced because manufacturing can be achieved through a continuous process from the preparation of the fibrous support 10 to the formation of the shell layer 20.

When embedded in a composite structure, the core-shell structured fiber-type strain sensor 1 manufactured according to the present disclosure, wherein the multilayered shell of the elastomer layer and the conductive layer 22 are formed on the surface of the fibrous support 10 with high strength and stiffness, can measure strain based on the change in resistance in the conductive layer 22 while improving bearing power for external load such as tensile, compressive or flexural load.

Hereinafter, the present disclosure will be described in detail through examples and test examples.

However, the following examples and test examples are for illustrative purposes only and it will be apparent to those of ordinary skill in the art that the scope of the present disclosure is not limited by the examples and test examples.

EXAMPLES

Examples 1-4. Preparation of Core-Shell Structured Fiber-Type Strain Sensor

Preparation of Fibrous Support Forming Core

Figure 4:
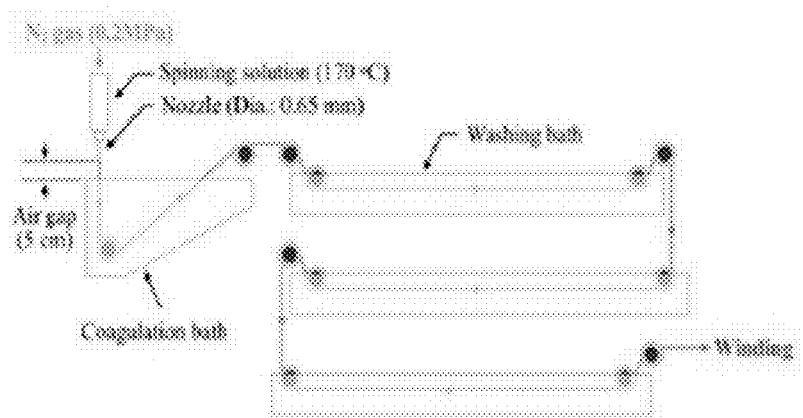
FIG. 4 schematically shows a dry-jet wet spinning system used to prepare a fibrous support in an exemplary embodiment of the present disclosure.

An ultrahigh-molecular-weight polyolefin-based fibrous support (core fiber) was prepared through a wet process. Specifically, the fibrous support was prepared using a dry-jet wet spinning system illustrated in FIG. 4.

First, UHMWPE powder (U050: average molecular weight $5\times10^6$ g/mol, Korea Petrochemical) was mixed with paraffin oil (Sigma-Aldrich). Then, the mixture was kept at 100° C. for 24 hours for swelling in order to improve the chain mobility of UHMWPE. After preparing a 4 wt % solution by dissolving the swollen UHMWPE powder in paraffin oil at 170° C. for 4 hours, the molecular chain of the UHMWPE solution was stabilized by storing in a spinning solution syringe at the same temperature for 2 hours.

Then, UHMWPE core fiber was spun using the dry-jet wet spinning method. The UHMWPE fiber was prepared by supplying the UHMWPE solution to a nozzle under a $N_2$ gas pressure of 0.2 MPa in order to prevent thermal decomposition of the solution and ensure uniform extrusion from the nozzle.

Then, the paraffin oil remaining in the UHMWPE fiber was removed.

Formation of Multilayered Shell Layer

First, the prepared UHMWPE fiber was heat-drawn through rollers of different speeds in order to maximize mechanical properties.

Figure 5:
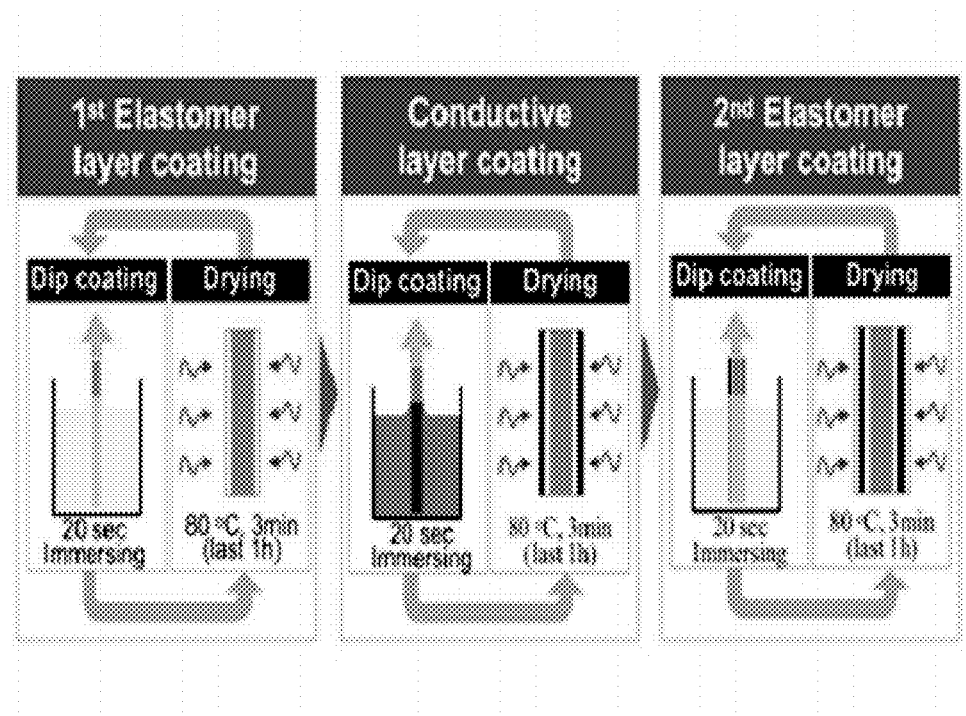
FIG. 5 schematically shows a coating process for forming a multilayered shell structure according to an exemplary embodiment of the present disclosure.

Then, a multilayered shell layer was formed on the UHMWPE fiber. FIG. 5 schematically shows a coating process for forming a multilayered shell structure according to an exemplary embodiment of the present disclosure.

The method for forming the multilayered shell layer is described referring to FIG. 5.

First, the UHMWPE fiber was dipped in an aqueous PU solution (CRP 26301, T&L Co., Ltd) for 20 seconds. Then, the PU-coated fiber was dried at 80° C. for 3 minutes. This procedure was repeated 3 times.

Then, a conductive layer was formed on the PU-coated UHMWPE fiber using an aqueous MWCNT solution (Kumho Petrochemical) (Examples 1-4). The structure of the conductive layers of Examples 1-4 is described in Table 1. Meanwhile, a sandwich-structured conductive layer was formed through the same coating procedure by coating a 3 wt % MWCNT first unit conductive layer, a 2 wt % MWCNT second unit conductive layer and a 3 wt % MWCNT third unit conductive layer.

Then, the conductive layer-coated UHMWPE fiber was dried in an oven at 60° C. for 1 hour to remove excess water from the MWCNT layer.

Finally, a core-shell structured fiber-type strain sensor was prepared by coating a second PU layer on the conductive layer-coated UHMWPE fiber.

TABLE 1

| | Structure of MWCNT layer |
|---|---|
| Example 1 (SP-SC3) | Single layer: 3 wt % |
| Example 2 (DP-SC2) | Single layer: 2 wt % |

TABLE 1-continued

| | Structure of MWCNT layer |
|---|---|
| Example 3 (DP-SC3) | Single layer: 3 wt % |
| Example 4 (DP-MC) | Sandwich multilayer: 3/2/3 wt % |

Test Examples

Test Example 1. DSC Analysis of UHMWPE Fiber

The UHMWPE fiber was subjected to DSC analysis. The result is shown in FIG. 6.

Figure 6:
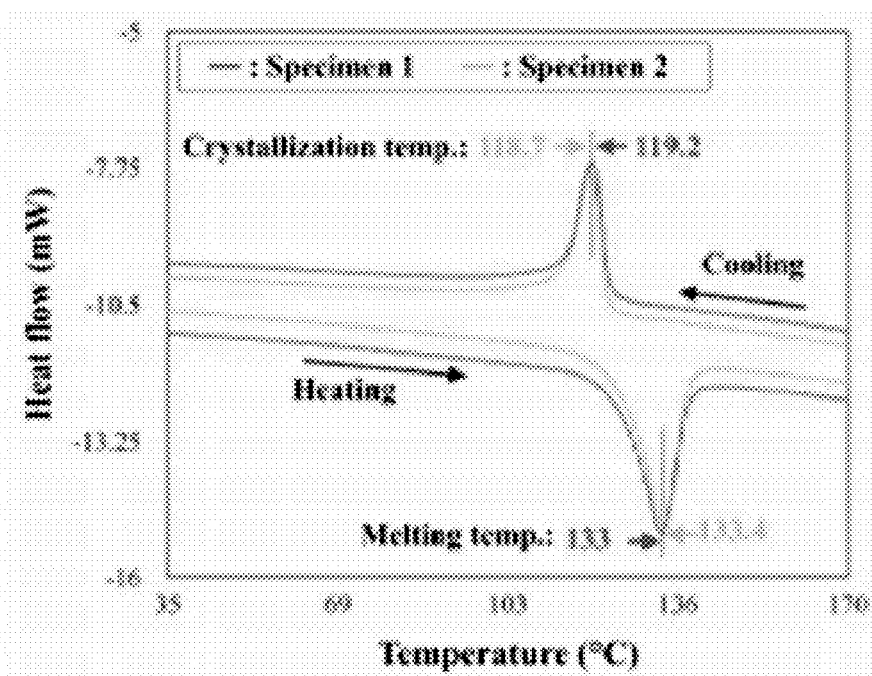
FIG. 6 shows a DSC analysis result for UHMWPE fiber prepared in an exemplary embodiment of the present disclosure.

FIG. 6 shows the DSC analysis result for the spun UHMWPE fiber.

As a result, it was confirmed that the spun fiber had crystallization and crystallization and melting temperatures of 119 and 133° C., respectively.

The UHMWPE fiber has improved mobility of polymer chains near the melting point. In this case, the amorphous region of the fiber can be easily crystallized in response to external force and temperature.

And, when the heated fiber is cooled to around the crystallization temperature, recrystallization occurs not only in the crystalline region but also in the amorphous region.

This phenomenon can lead to improvement in the mechanical characteristics of the UHMWPE fiber due to increased crystallinity and chain arrangement Test Example 2. Analysis of Mechanical Characteristics of UHMWPE Fiber The mechanical characteristics of the UHMWPE fiber prepared in the examples were analyzed. The result is shown in FIG. 7.

Figure 7:
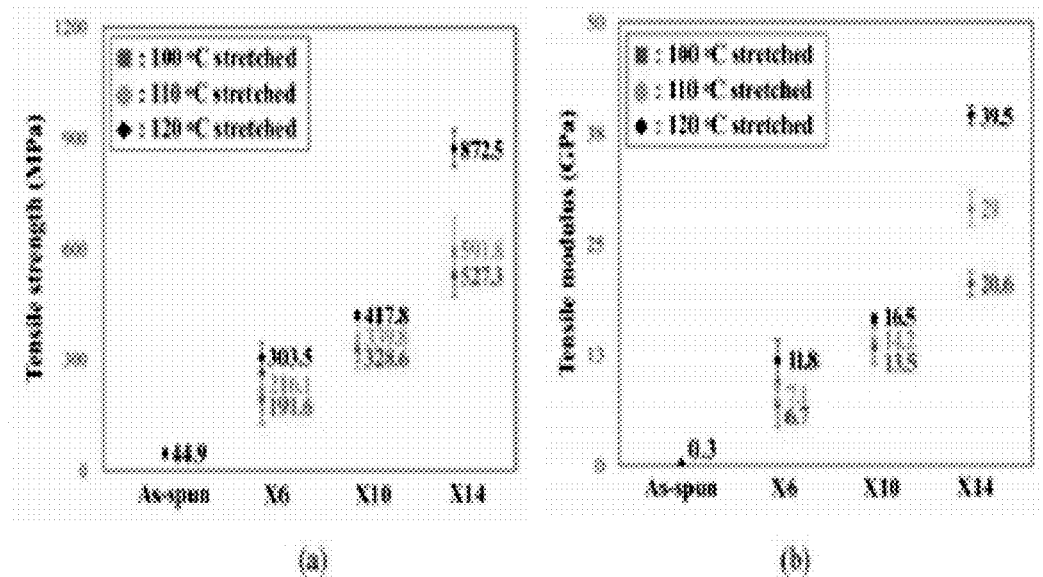
FIG. 7 shows the mechanical properties of UHMWPE fiber prepared in an exemplary embodiment of the present disclosure ((a): tensile strength, (b): tensile modulus).

FIG. 7 shows the mechanical properties of the UHMWPE fiber prepared in the examples ((a): tensile strength, (b): tensile modulus).

Referring to FIG. 7, it can be seen that the tensile strength and modulus of the core fiber are improved as the drawing ratio and the heat drawing temperature are increased. It may be because the crystallinity of the core fiber is increased due to rearrangement or reorientation of the molecular chain during the heat drawing process.

In particular, the highest tensile strength and modulus were achieved at the highest temperature, which can be explained from the thermal analysis result of the spun fiber.

Test Example 3. Measurement of Surface Morphology and Electrical Resistance of Fiber-Type Strain Sensor The surface morphology and electrical resistance of the fiber-type strain sensor prepared in the examples were measured.

Figure 8:
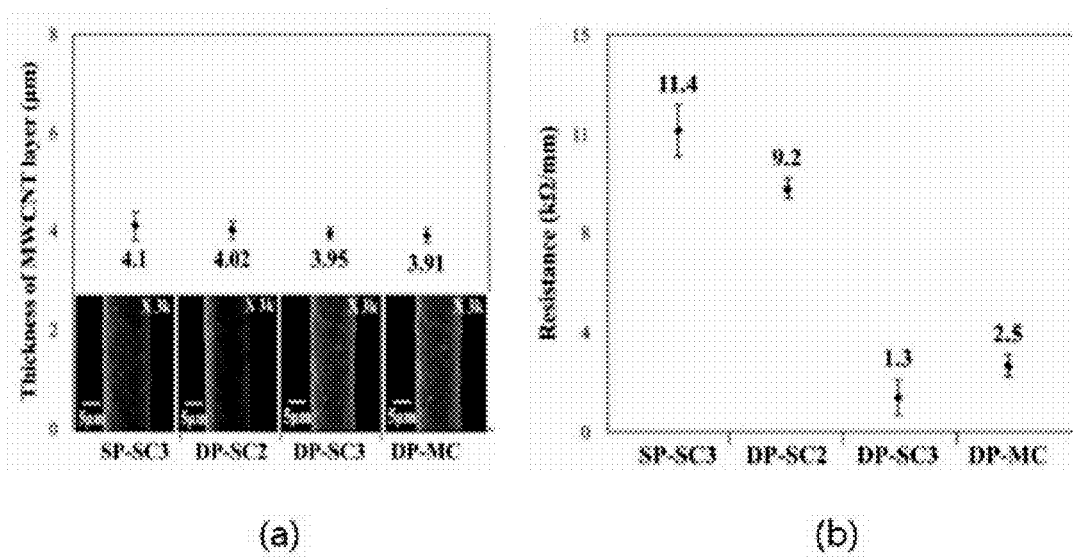
FIG. 8 shows the surface morphology and electrical resistance of a fiber-type strain sensor manufactured in an exemplary embodiment of the present disclosure ((a): coating thickness and surface morphology of MWCNT layer, (b) electrical resistance of sensor fiber).

The result is shown in FIG. 8. FIG. 8 shows the surface morphology and electrical resistance of the fiber-type strain sensors prepared in the examples ((a): coating thickness and surface morphology of MWCNT layer, (b) electrical resistance of sensor fiber).

First, FIG. 8(a) shows the surface morphology of the coated fiber depending on the order of coating. Referring to FIG. 8(a), it can be seen that the MWCNT coating layer was formed uniformly on the fiber through dip coating. The thickness of the MWCNT coating layer was controlled to 4 μm by varying the number of dip coating.

FIG. 8(b) shows the electrical resistance measurement result for the fiber-type strain sensor. Referring to FIG. 8(b), it can be seen that the electrical resistance is related with the concentration of the MWCNT layer. It seems that DP-SC3 shows decreased electrical resistance as compared to DP-SC2 due to densely formed electric paths.

Consequently, it seems that the densely packed sample exhibits low electrical resistance. In particular, the sandwich-structured MWCNT layer sample showed a resistance value intermediate between DP-SC2 and DP-SC3 due to the combination of the low-concentration layer and the high-concentration layer.

Test Example 4. Measurement of Sensitivity of Fiber-Type Strain Sensor

The sensitivity of the fiber-type strain sensors prepared in the examples was measured.

Figure 9:
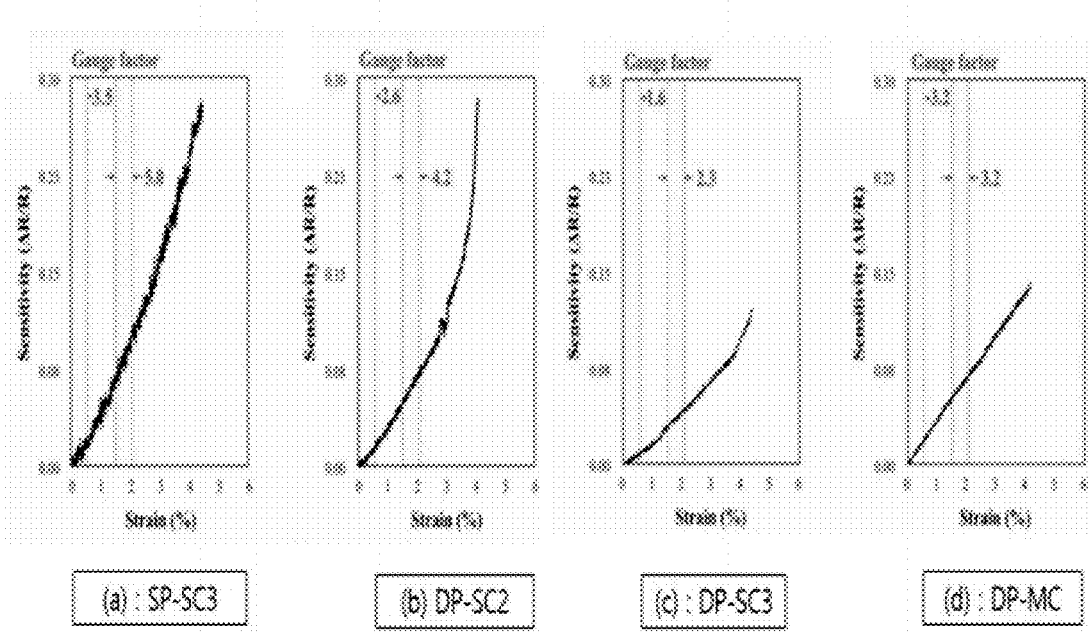
FIG. 9 shows a strain sensitivity measurement result of a fiber-type strain sensor.

The result is shown in FIG. 9. FIG. 9 shows the strain sensitivity measurement result of the fiber-type strain sensors.

Figure 10:
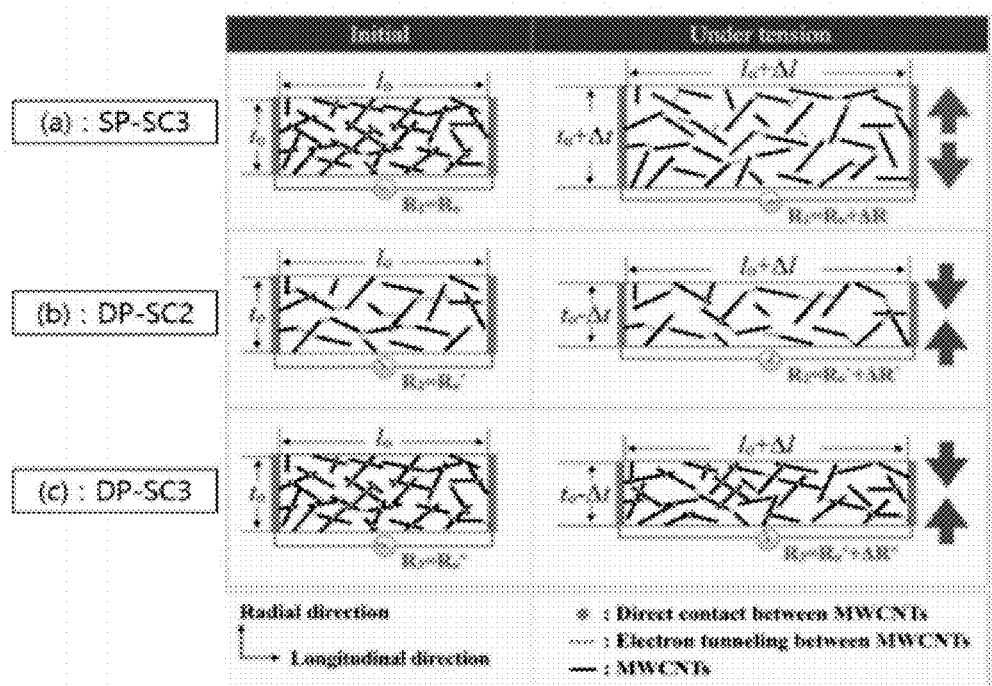
FIG. 10 is the circuit diagram of an electrical network according to an exemplary embodiment of the present disclosure.

FIG. 10 shows the circuit diagrams of electrical networks according to an exemplary embodiment of the present disclosure.

Referring to FIG. 9, all of Examples 1-4 show increase in sensitivity. It is because of the resistance occurring in the conductive layer due to breakdown of the conductive network caused by tensile load. In addition, when external tensile load is applied to the sensor, the relative distance between MWCNTs is increased. As a result, the total electrical resistance is decreased due to breakdown of the MWCNT network.

Referring to FIGS. 9(a) and 9(b) and FIG. 10, the single PU layer is more sensitive than the double PU layer. The single PU layer has higher sensitivity because the resistance changes rapidly due to abrupt increase in the distance between CNTs because of the tensile strain in the radial direction of the CNT layer, as shown in FIG. 10(a). In contrast, as shown in FIGS. 10(b) and 10(c), the double PU layer showed relatively smaller change in resistance due to the compressive deformation occurring in the radial direction when external tensile load is applied.

Referring to FIG. 9(b), the fiber-type strain sensor of Example 2 showed the highest, nonlinear sensitivity, probably due to the low MWCNT concentration. For reference, this phenomenon occurred because the tunneling effect was dominant over the direct contact with MWCNT in formation of electric paths when the concentration of the MWCNT layer was low. The total resistance of the conductive layer was increased abruptly when one of the electric paths was broken due to external load. For Example 2, although the sensitivity is high, sensitivity response may be unstable because the electric paths are weak.

For Example 2, the sensor showed nonlinear behavior as a result of gauge factor (GF) fitting. Specifically, the GF value was remarkably increased to 161% in the strain range of 3-4% as compared to the strain range of 1-2%.

Referring to FIG. 9(c), the linearity of the sensitivity curve was improved for Example 3 as compared to Example 2 due to increased MWCNT concentration. In addition, as a result of the GF fitting, the GF value was increased by 50% or more in the strain range of 1-2% for Example 3. Example 3 exhibited stable response with lower noise level than Example 2 due to increased number of electric paths caused by increased MWCNT content. For Example 3, the maximum sensitivity was increased by 55% as compared to Example 2.

Based on the sensitivity measurement result for the optical fiber sensor having a mono-MWCNT layer structure, it was confirmed that the improvement of the linearity of sensitivity response is limited due to the use of the single layer structure.

The linear response of a strain sensor is important for accurate strain sensing and signal processing. Accordingly, the sandwich-structured MWCNT layer was introduced to improve the linearity of sensing response.

From the sensitivity measurement result for the sensor fiber having the sandwich-structured MWCNT layer shown in FIG. 9(d), it can be seen that the linear sensitivity response was improved. This suggests that the combination of MWCNT layers with different concentrations is effective in improving the linearity of measurement signals.

Test Example 5. SNR Measurement of Fiber-Type Strain Sensor

The signal-to-noise ratio (SNR) of the fiber-type strain sensors prepared in Examples 1 and 3 was measured.

Figure 11:
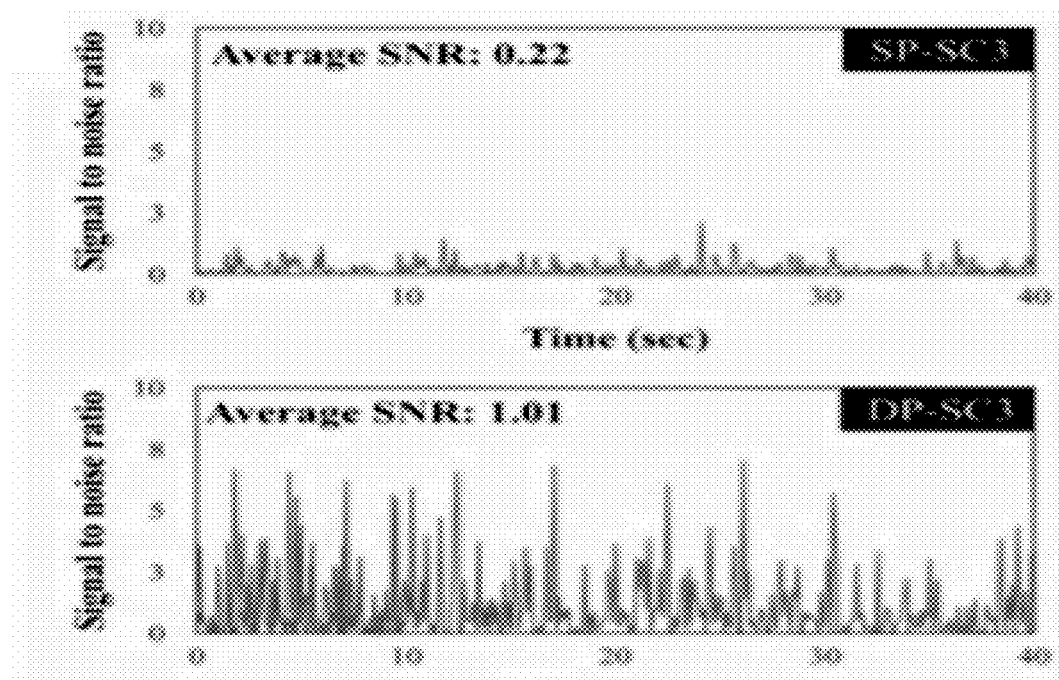
FIG. 11 shows an SNR measurement result of fiber-type strain sensors manufactured in Examples 1 and 3.

FIG. 11 shows the SNR measurement result for the fiber-type strain sensors prepared in Examples 1 and 3. The SNR is a measure of the relative magnitude of signal to noise defined by the following equation. A larger SNR means that the effect of noise is smaller.

$$SNR = S^2/\sigma^2$$

In the above equation, S is the electrical resistance sensing signal sensed by a fiber sensor, and σ is the standard deviation of the electrical resistance sensing signal.

Referring to FIG. 11, the average SNR of DP-SC3 was higher by 359% when compared with the average SNR of SP-SC3. This means that the double PU layer reduces noise level.

Figure 12:
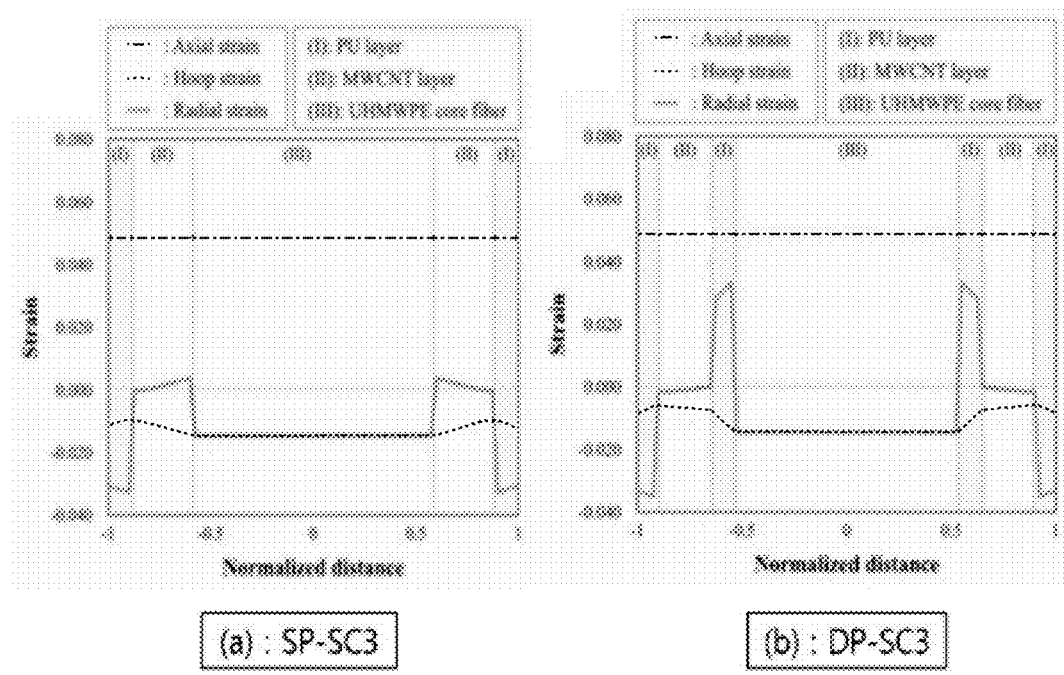
FIG. 12 shows the strain distribution of fiber-type strain sensors manufactured in Examples 1 and 3.

FIG. 12 shows the strain distribution of the fiber-type strain sensors prepared in Examples 1 and 3.

Referring to FIG. 12, for the SP-SC3 single PU layer, it can be seen that the core fiber is stretched along the radial direction of the MWCNT layer due to the Poisson's effect, which may lead to the breakdown of the electrical network in the MWCNT layer (a). In contrast, for the DP-SC3 double PU layer, compressive deformation was formed along the radial direction of the MWCNT layer because the low elasticity coefficient of the first PU layer between the MWCNT layer and the UHMWPE core fiber compensated for the contraction of the core fiber (b). As seen from FIG. 12(b), this effect is confirmed by the significant tensile strain along the radial direction of the first PU layer caused by the Poisson contraction along the radial direction of the core fiber and the MWCNT layer. This, in association with FIG. 11, means that the double PU layer had a positive effect on the noise level decrease of the fiber sensor by preventing the breakdown of the electrical network in the conductive layer.

Figure 13:
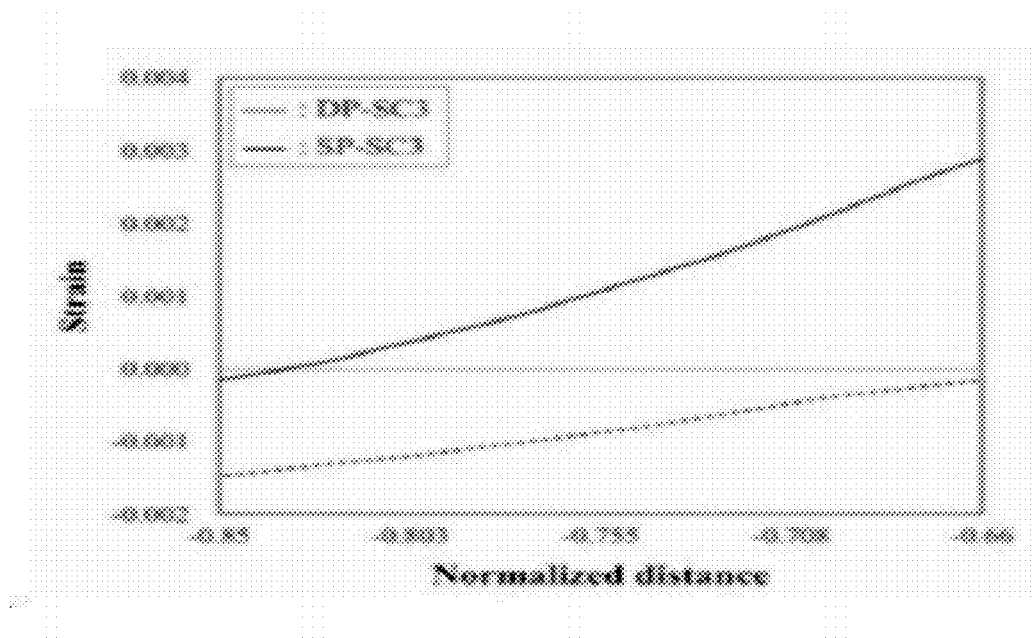
FIG. 13 shows the radial strain in MWCNT layers of fiber-type strain sensors manufactured in Examples 1 and 3.

FIG. 13 shows the radial strain in the MWCNT layers of the fiber-type strain sensors prepared in Examples 1 and 3.

Referring to FIG. 13, the radial strain of the MWCNT layer in DP-SC3 is lower than the radial strain of the MWCNT layer in SP-SC3. Accordingly, it can be seen that, when compared with FIG. 11 and FIG. 12, the double PU layer provides an effect of reducing noise by preventing the breakdown of the electrical network in the MWCNT layer.

Test Example 6. Measurement of $\Delta R/R_0$ of Fiber-Type Sensor Over 1000 Cycles The $\Delta R/R_0$ value of the fiber-type strain sensors prepared in Examples 2-4 was measured over 1000 cycles.

Figure 14:
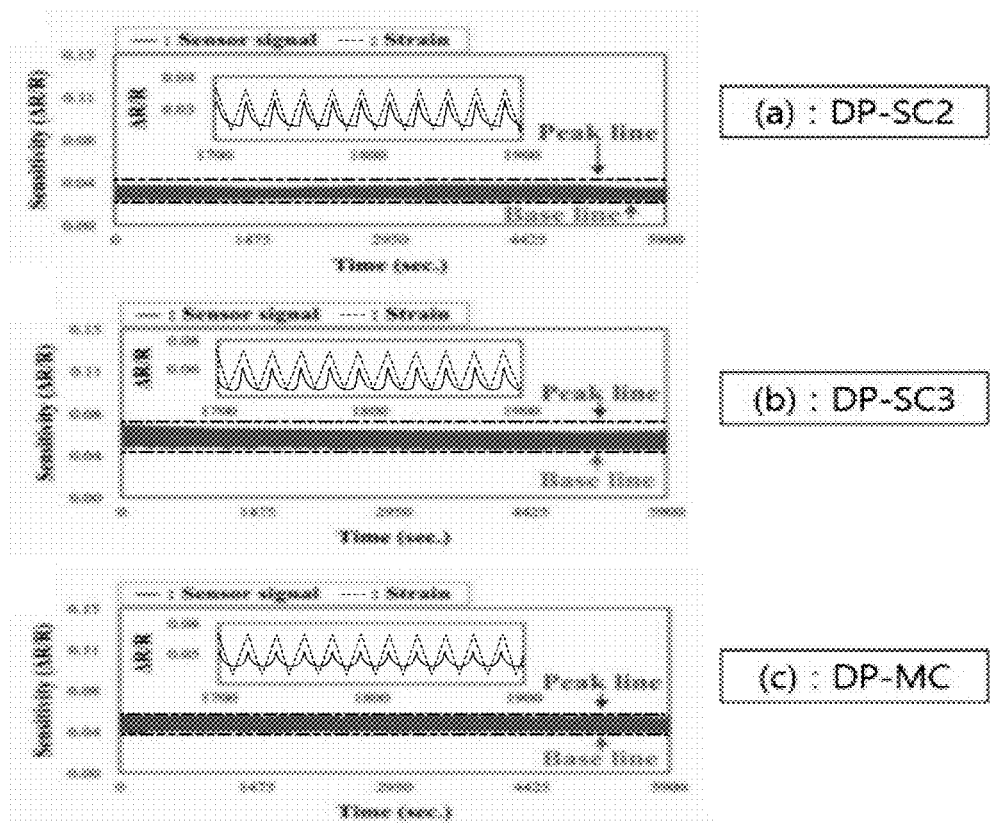
FIG. 14 shows a $\Delta R/R_0$ measurement result for fiber-type strain sensors manufactured in Examples 2-4 over 1000 cycles and schematics of electrical networks.

The result is shown in FIG. 14. FIG. 14 shows the $\Delta R/R_0$ measurement result for fiber-type strain sensors prepared in Examples 2-4 over 1000 cycles and schematics of electrical networks. Here, $R_0$ is the initial electrical resistance before application of tensile load, and $\Delta R$ is the change of the electrical resistance due to tensile strain.

Referring to FIG. 14, all of Examples 2-4 showed recoverable signal responses, which is attributable to the PU layer. In addition, due to the flexibility and elasticity of the PU layer, the breakdown and reconstruction of the network were repeated stably during the drawing release cycles.

A strong interface with the MWCNT layer could be formed due to the superior adhesion property of the PU layer. While the reproducibility itself can be embodied with the PU layer, the stability of electrical signals such as signal change is affectivity of the rigidity of the electrical network in the MWCNT layer. For this reason, different signal patterns were observed for the double PU layers of Examples 2-4.

More specifically, for DP-SC2, the sensing signals were unstable during the loading-unloading cycles because the conductive network was not recovered completely after each cycle. In addition, the relative change in resistance at high cycles showed non-monotonic response due to the waveform (buckle form) of MWCNT formed in the preceding cycles (a). Although DP-SC3 showed more stable response than DP-SC2, the peak resistance was decreased gradually by 10% after 1000 cycles (b). In contrast, for DP-MC, the decrease in initial and final peak resistance after 100 cycles was less than 1% (c). This means that stable signal response was achieved in the cycle test because a conductive network of multiple conductive MWCNT layers with high density was formed.

Figure 15:
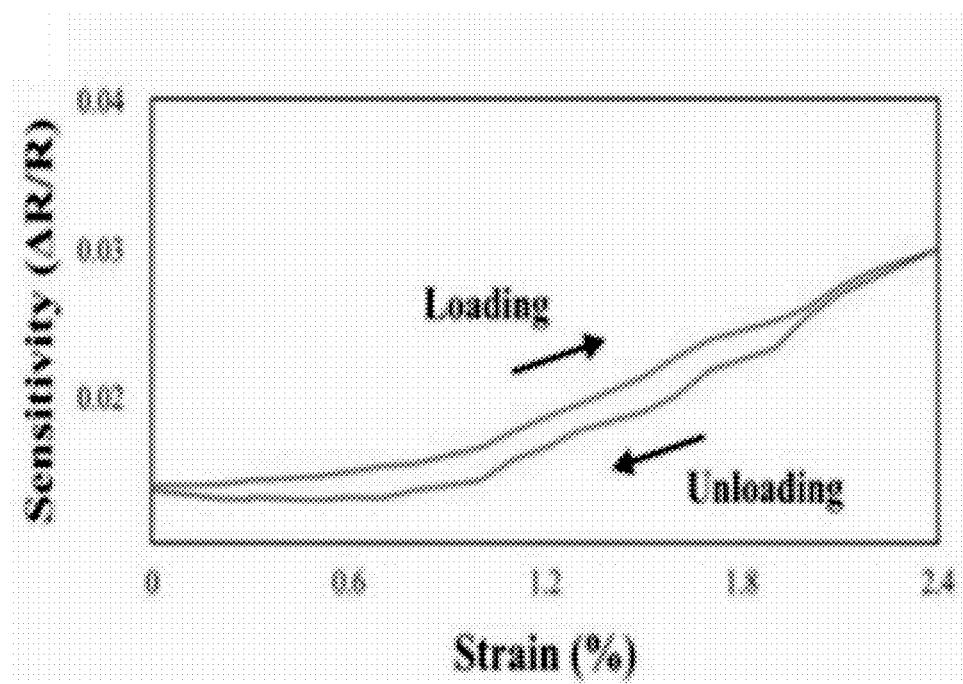
FIG. 15 shows a hysteresis curve of DP-MC.

FIG. 15 shows the hysteresis curve of DP-MC.

Referring to FIG. 15, when DP-MC was used, a hysteresis of about 6% was achieved after a single drawing-release cycle, which is lower than the value reported for the existing fiber-type strain sensor.

The invention claimed is:

1. A core-shell structured fiber-type strain sensor, comprising:
   a fibrous support forming a core; and
   a multilayered shell layer formed on the fibrous support,
   wherein the shell layer comprising:
      a first elastomer formed on the fibrous support;
      a conductive layer formed on the first elastomer; and
      a second elastomer formed on the conductive layer,
   wherein the sensor senses the strain of a structure comprising the sensor based on the change in resistance of the conductive layer,
   wherein the conductive layer has a sandwich structure wherein at least two unit conductive layers having different conductivity are laminated sequentially,
   wherein the unit conductive layer comprises conductive particles, and the two unit conductive layers have different conductivity by varying the wt % of the conductive particles.

2. The core-shell structured fiber-type strain sensor of claim 1, wherein the sandwich structure comprising:
   a first unit conductive layer; and
   a second unit conductive layer,
   wherein the second unit conductive layer comprises the conductive particles at a lower percentage than the first unit conductive layer.

3. The core-shell structured fiber-type strain sensor of claim 2, wherein the fibrous support is a single filament.

4. The core-shell structured fiber-type strain sensor of claim 1, wherein the first elastomer and the second elastomer have higher Poisson's ratios than the fibrous support.

5. The core-shell structured fiber-type strain sensor of claim 4, wherein the first elastomer and the second elastomer comprise one selected from a group consisting of polyurethane (PU), polydimethylsiloxane (PDMS), natural rubber (NR), butadiene rubber (BR), styrene-butadiene rubber (SBR), acrylonitrile-butadiene rubber (NBR) and ethylene-vinyl acetate (EVA).

6. The core-shell structured fiber-type strain sensor of claim 1, wherein the conductive particle comprises one selected from a group consisting of carbon nanotube, graphene, silver nanowire and gold nanowire.

7. A method for manufacturing a core-shell structured fiber-type strain sensor, comprising:
   a step of coating a first elastomer on a fibrous support;
   a step of coating a sandwich-structured conductive layer on the first elastomer; and
   a step of coating a second elastomer on the conductive layer,
   wherein the sandwich-structured conductive layer has a structure wherein unit conductive layers having different conductivity are laminated sequentially,
   wherein the coating is performed by dipping or spraying.

8. The method for manufacturing a core-shell structured fiber-type strain sensor of claim 7, wherein the unit conductive layer comprises conductive particles, and the two unit conductive layers have different conductivity by varying the wt % of the conductive particles.

9. The method for manufacturing a core-shell structured fiber-type strain sensor of claim 8, wherein the conductive layer has a sandwich structure comprising:
   a first unit conductive layer; and
   a second unit conductive layer,
   wherein the second unit conductive layer comprises the conductive particles at a lower percentage than the first unit conductive layer.

10. The method for manufacturing a core-shell structured fiber-type strain sensor of claim 7, wherein the fibrous support is a single filament.

11. The method for manufacturing a core-shell structured fiber-type strain sensor of claim 7, wherein the first elastomer and the second elastomer have higher Poisson's ratios than the fibrous support.

12. The method for manufacturing a core-shell structured fiber-type strain sensor of claim 7, wherein the first elastomer and the second elastomer comprise one selected from a group consisting of polyurethane (PU), polydimethylsiloxane (PDMS), natural rubber (NR), butadiene rubber (BR), styrene-butadiene rubber (SBR), acrylonitrile-butadiene rubber (NBR) and ethylene-vinyl acetate (EVA).

13. The method for manufacturing a core-shell structured fiber-type strain sensor of claim 7, wherein the conductive particle comprises one selected from a group consisting of carbon nanotube, graphene, silver nanowire and gold nanowire.

14. A core-shell structured fiber-type strain sensor, comprising:
   a fibrous support forming a core; and
   a multilayered shell layer formed on the fibrous support, the shell layer comprising:
      a first elastomer formed on the fibrous support;
      a conductive layer formed on the first elastomer; and
      a second elastomer formed on the conductive layer,
      wherein the conductive layer has a sandwich structure comprising:
         a first unit conductive layer; and
         a second unit conductive layer,
         wherein the first unit conductive layer and the second unit conductive layer have different conductivity.

15. The core-shell structured fiber-type strain sensor of claim 14, wherein the fibrous support is a single filament.

16. The core-shell structured fiber-type strain sensor of claim 14, wherein the first elastomer and the second elastomer have higher Poisson's ratios than the fibrous support.

17. The core-shell structured fiber-type strain sensor of claim 14, wherein the first elastomer and the second elastomer comprise one selected from a group consisting of polyurethane (PU), polydimethylsiloxane (PDMS), natural rubber (NR), butadiene rubber (BR), styrene-butadiene rubber (SBR), acrylonitrile-butadiene rubber (NBR) and ethylene-vinyl acetate (EVA).

\* \* \* \* \*